United States Patent [19]
Burrows et al.

[11] Patent Number: 4,740,970
[45] Date of Patent: Apr. 26, 1988

[54] INTEGRATED CIRCUIT ARRANGEMENT

[75] Inventors: David F. Burrows, Awbridge; Mark Paraskeva, Southampton; William L. Knight, Fareham, all of England

[73] Assignee: Plessey Overseas Limited, Ilford, England

[21] Appl. No.: 807,912

[22] Filed: Dec. 11, 1985

[30] Foreign Application Priority Data

Jan. 17, 1985 [GB] United Kingdom ............... 8501143

[51] Int. Cl.⁴ .................. G01R 31/28; G06F 11/00
[52] U.S. Cl. ........................................ 371/15; 371/25
[58] Field of Search ............ 371/25, 15; 324/73 R, 324/73 AT

[56] References Cited

U.S. PATENT DOCUMENTS

| | | | |
|---|---|---|---|
| 4,320,509 | 3/1982 | Davidson | 371/25 |
| 4,340,857 | 7/1982 | Fasang | 324/73 R |
| 4,433,413 | 2/1984 | Fasang | 371/25 |
| 4,493,078 | 1/1985 | Daniels | 371/25 |
| 4,594,711 | 6/1986 | Thatte | 371/25 |
| 4,597,080 | 6/1986 | Thatte et al. | 371/25 |

OTHER PUBLICATIONS

Konemann et al., Built-In Test for Complex Digital Integrated Circuits, IEEE Journal of Solid-State Circuits, vol. 3C-15, No. 3, Jun. 1980, pp. 315-319.
Fasang, Circuit Module Implements Practical Self-Testing, Electronics, May 19, 1982, pp. 164-167.
LeBlanc, LOCST: A Built-In Self-Test Technique, IEEE Design & Test, Nov. 1984, pp. 45-52.

Primary Examiner—Charles E. Atkinson
Attorney, Agent, or Firm—Michael F. Oglo; Julian C. Renfro

[57] ABSTRACT

A circuit arrangement for use in an integrated circuit having a built-in self test design, the circuit arrangement comprising first and second gates coupled to a flip-flop via a third gate. The present invention provides a multiplexer coupled to one input of the first gate, the multiplexer being controllable by a control signal to feed either input data or output data of the circuit arrangement to said one input of the first gate and a fourth gate coupled to an input of the second gate, the fourth gate having an input connected to receive a signal dependent on the control signal to the data selector means.

8 Claims, 9 Drawing Sheets

FULL 'BILBO' REGISTER  FIG. 2a.

SEPERATE REGISTER MODE (AB = 10, C = X) FIG. 2b.

SCAN PATH MODE (AB = 01, C SELECTS SCAN IN) FIG. 2c.

TEST PATTERN GENERATOR MODE (AB = 01, C SELECTS FEEDBACK)

PARALLEL SIGNATURE ANALYSER MODE (AB 11, C SELECTS FEEDBACK)

INTEGRATED CIRCUIT ARRANGEMENT

BACKGROUND OF THE INVENTION

The present invention relates to circuits and more particularly to a circuit arrangement for use in a register for the built-in self test of integrated circuits.

A known circuit arrangement is shown in FIG. 1 of the accompanying drawings and comprises two AND gates 3,8 coupled to a flip-flop 2 by means of an Exclusive OR gate 4. When the circuit arrangement is in use each of the inputs of the AND gate 8 respectively receives data input signals DI and control signals from a control line A, whilst each input of the AND gate 3 respectively receives serial input signals SI and control signals from a control line B. If a number of the circuit arrangements of FIG. 1 are arranged in series they form the basis of a known Built-In Logic Block Observation (BILBO) register. Such a register is illustrated in FIG. 2a of the drawings and the equivalent circuit for each of the modes of operation are shown in FIGS. 2(b–e).

FIG. 2a shows a five bit BILBO register of known type comprising five D-type flip-flops 2 coupled in series, the input of the first D-type flip-flop 2 in the series being connected to the output of an Exclusive-OR gate 14 and the inputs of each of the other four D-type flip-flops 2 in the series being connected similarly to the output of a respective Exclusive-OR gate 4. One of the inputs of the Exclusive-OR gate 14 is connected to the output of an AND gate 12 and similarly one of the inputs of each of the Exclusive-OR gates 4 is connected to the output of a respective AND gate 3. The other input of each of the Exclusive-OR gates 14, 4 is connected to the output of a respective AND gate 8. The inputs of each of the AND gates 8 are connected respectively to a common line A and to a respective output of a combinatorial logic network (not shown). The inputs of each of the AND gates 3 are connected respectively to a common line B and the output of one of the flip-flops 2, each of the inputs of the AND gate 12 being connected respectively to the common line B and the output of a multiplexer MUX.

The outputs of the second and fifth D-type flip-flops 2 in the series are connected to the inputs of an Exclusive-OR gate 10 the output of which is coupled to the input of the first D-type flip-flop 2 via the multiplexer MUX, the AND gate 12 and the Exclusive-OR gate 14. In practice only certain combinations of outputs from the D-type flip-flops 2 can be tapped for these feedback connections if it is desired to provide a maximal length test pattern when the BILBO register is in its test pattern generator mode. These combinations of outputs are known in the electronic field and are dependent on the number of D-type flip-flips 2 in the BILBO register.

The values of the signals on control lines A and B control the different functions that the BILBO register can perform. SCAN-IN is the scan-in input to the BILBO register, SCAN-OUT is the scan-out output for the BILBO register and the five output values for the D-type flip-flops 2 appear at the five output lines $C_1$, $C_2$, $C_3$, $C_4$ and $C_5$. The output line $C_5$ also serves as the SCAN OUT.

There are five modes of operation for the BILBO register. The first is illustrated in FIG. 2b with the signals on the lines A and B equal to 1 and 0 respectively. This is a mode of operation in which the input values from the combinatorial logic network are loaded into the D-type flip-flops 2, and the outputs on the five lines $C_1$, $C_2$, $C_3$, $C_4$ and $C_5$ are available for system operation. The BILBO register behaves therefore with a normal register function.

In the second mode of operation, illustrated in FIG. 2c, the values of the control lines A and B are 0 and 1 respectively and a control line C to the multiplexer MUX is set so as to connect the scan-in input to the input of the AND gate 12, through the multiplexer MUX. In this mode the BILBO register behaves as a linear shift register, that is in a scan path mode.

In FIG. 2d the values on the control lines A and B are 0 and 1 respectively and the control line C to the multiplexer MUX is set so as to connect the feedback line to the input of the AND gate 12. In this third mode, the BILBO register behaves as a pseudo-random number generator useful in providing test patterns for a combinatorial logic network coupled to its output lines $C_1$, $C_2$, $C_3$, $C_4$ and $C_5$, it is therefore referred to as being in its test pattern generator mode.

In FIG. 2e the values on the control lines A and B are both 1 and the control line C to the multiplexer MUX is set to connect the feedback line to the input of the AND gate 12. In this fourth mode the BILBO register behaves as a linear feedback shift register with multiple linear inputs. If the predetermined input signals are fed to a correctly functioning combinatorial logic network and the outputs of the combinatorial logic networks are connected to the inputs of the BILBO in this mode then after a large number of shift clocks there will be a characteristic signature left in the BILBO register for that correctly functioning logic network. Hence the mode is referred to as a signature analyser mode. The signature of the combinatorial logic network can be off-loaded from the BILBO register to the SCAN-OUT output by changing to the Scan Path Mode of FIG. 2c, that is by changing the values of the control lines A and B to 0 and 1 respectively.

In the fifth mode of operation the values on the control lines A and B are both set at 0 in which mode the BILBO register of FIG. 2a executes a synchronous reset.

We have found that the above described BILBO circuit arrangement and the BILBO register described above with reference to FIGS. 1 and 2, because of the restricted number of functional modes of operation, has limitations when incorporated into a built-in self testing integrated circuit, particularly a very large integrated circuit.

The present invention has as one of its objects the provision of a circuit arrangement having a larger number of functional modes of operation than the BILBO described above such as to facilitate the design and self testing facility of built-in self test integrated circuits.

SUMMARY OF THE INVENTION

According to the present invention there is provided a circuit arrangement for use in an integrated circuit having a built-in self test design, the circuit arrangement comprising first and second gates coupled to a flip-flop via a third gate wherein the improvement lies in the provision of data selector means coupled to one input of the first gate, the data selector means being controllable by a control signal to feed either input data or output data of the circuit arrangement to said one input of the first gate and a fourth gate coupled to an input of the second gate, the fourth gate having an input connected to receive a signal dependent on the control signal to the data selector means.

In a preferred embodiment the third gate is an Exclusive-NOR gate. In another embodiment the third gate is an Exclusive-OR gate. In different embodiments the first gate may take the form of an AND gate, a NAND gate, an OR gate or a NOR gate, and similarly the second gate may take the form of an AND gate, a NAND gate, an OR gate or a NOR gate, and similarly the fourth gate may take the form of an AND gate, a NAND gate, an OR gate or a NOR gate. The particular selection and configurations of gates determine the truth table of the circuit arrangement and on modifications which can be made to the circuit arrangements by the inclusion or omission of inverters in the signal paths to or from the inputs or outputs of the gates or the flip flops or the data selector means.

In a preferred embodiment the first, second and fourth gates are each NAND gates and the third gate is an Exclusive-NOR gate.

In one embodiment there is provided a circuit arrangement comprising two AND gates coupled to a flip-flop via an Exclusive-OR gate wherein the improvement lies in the provision of a data selector means coupled to one input of one AND gate, the data selector means being controllable by a control signal to feed either input data or output data of the circuit arrangement to said one input and an OR gate coupled to one input of the other AND gate, the OR gate having an input connected to receive a signal dependent on said control signal to the data selector means. Conveniently, the data selector means comprises a multiplexer.

In one embodiment of the present invention a plurality of the circuit arrangements are coupled in series to define a register element. In a preferred embodiment the outputs of two or more of the flip-flops in the series are coupled to the inputs of another Exclusive-NOR gate the output of which is coupled to the input of one or more of the flip-flops in the series.

The present invention also provides an integrated circuit having a built-in self test facility, the integrated circuit including a plurality of the register elements coupled to at least one combinatorial logic circuit, control means being provided for selectively controlling the operation of the register elements during self test of the integrated circuit.

According to the present invention there is provided an integrated circuit partitioned into a plurality of register elements and at least one combinatorial logic circuit, each of the register elements being adapted to operate selectively in different operating modes in response to control signals from a control means, said operating modes including a PATTERN GENERATION/SCAN MODE, a SIGNATURE ANALYSIS MODE, a NORMAL REGISTER MODE, a HOLD MODE, a PRESET MODE, a RESET MODE and a TOGGLE MODE.

BRIEF DESCRIPTION OF THE DRAWINGS

The present invention will be described further, by way of example, with reference to the accompanying drawings in which.

DESCRIPTION OF EMBODIMENTS

Figure 1:
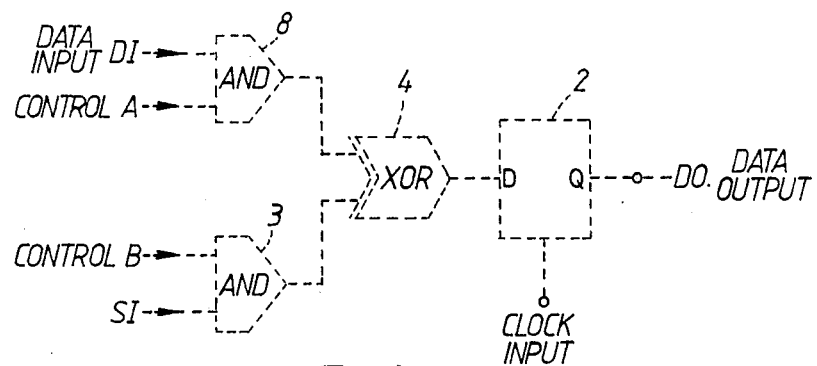
FIG. 1 illustrates a known circuit arrangement for use in a BILBO register.
Figure 2D:
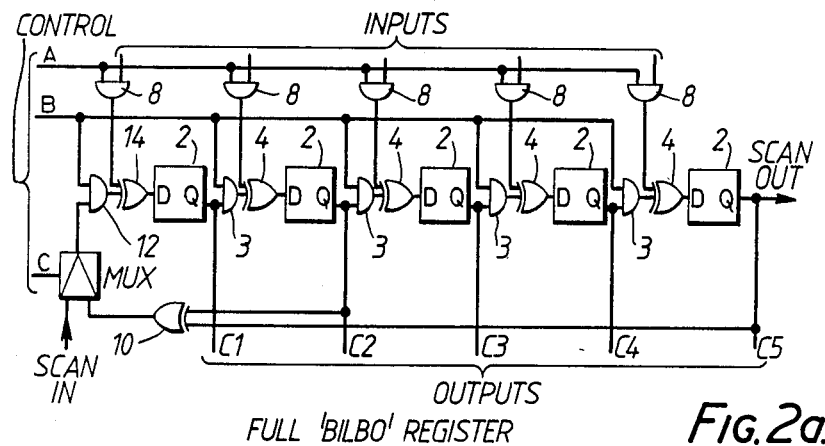
FIG. 2a illustrates a known BILBO register circuit using the circuit arrangements of FIG. 1, FIGS. 2b, 2c, 2d and 2e are equivalent circuits illustrating the modes of operation of the BILBO register of FIG. 2a, FIG. 3 illustrates a circuit arrangement in accordance with an embodiment of the present invention.
Figure 2D:
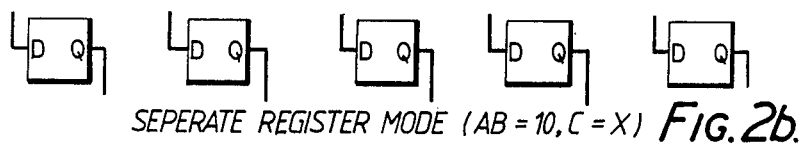
Figure 2D:
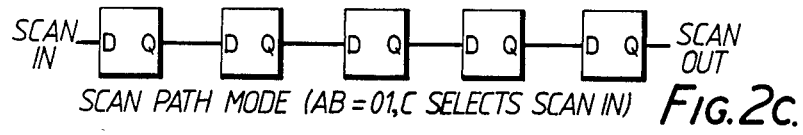
Figure 2D:
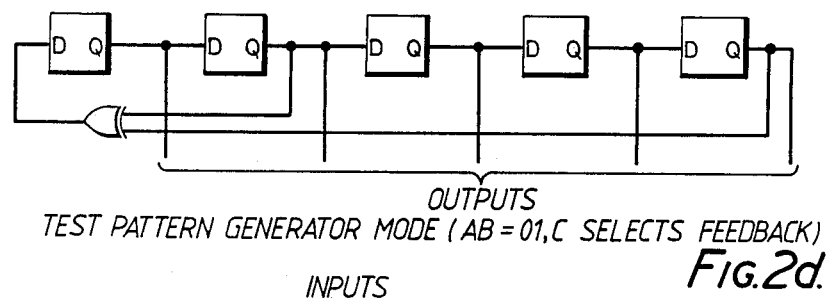
Figure 2E:
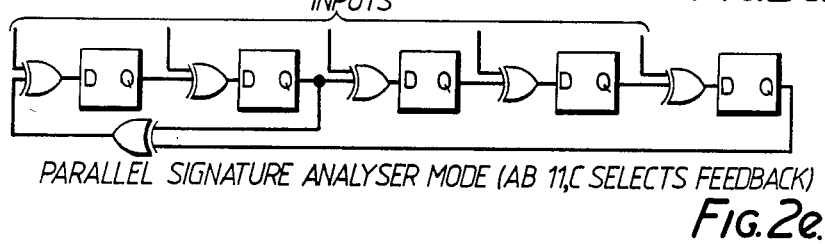

As already described for the known BILBO circuit arrangement of FIG. 1 and the known BILBO register circuit of FIG. 2a the data input DI is fed directly to an input of the AND gate 8 and the serial input SI is fed directly to an input of the AND gate 3. In accordance with one embodiment of the present invention the circuit arrangement and the register circuit have been modified in the manner shown in FIGS. 3 and 4, features in FIGS. 3 and 4 which are identical with features in FIGS. 1 and 2 bearing identical reference numerals.

Figure 3:
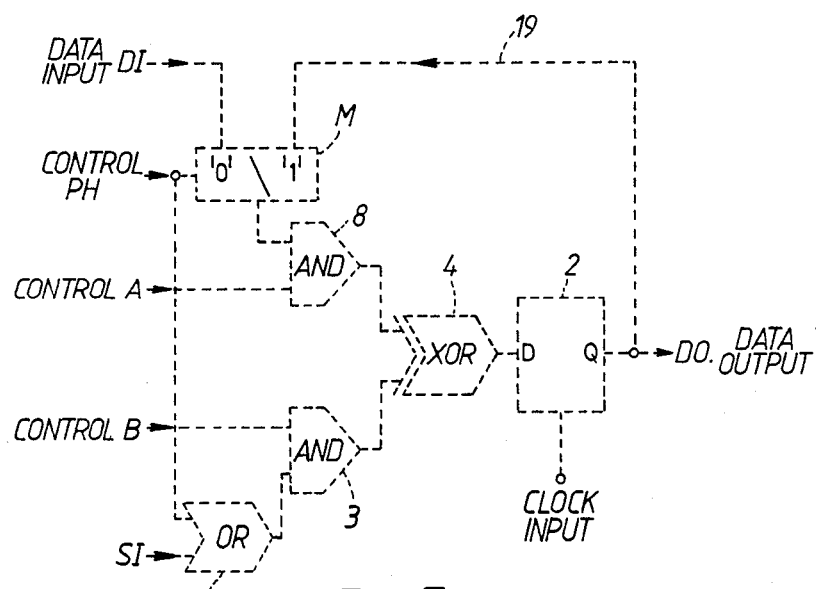

Referring to FIG. 3 a multiplexer M is provided with and is controlled by control signals PH to allow either the data input DI or output data DO, which is fed back along a line 19, to be selected as data to one of the input terminals of the AND gate 8. A further modification of the known BILBO circuit arrangement is the provision of an OR gate 13 having one of its input terminals arranged for receiving the serial input SI and its other input arranged for receiving the control signal PH. The provision of the OR gate 13 allows additional control of the input signals to one of the input terminals of the AND gate 3.

The function of the circuit arrangement of FIG. 3 is illustrated in the truth table 1 below in which X is representative that an input signal may be either 1 ('high') or 0 ('low').

TRUTH TABLE 1

| A | B | PH | SI | DI | DO |
|---|---|----|----|----|----|
| 0 | 0 | X  | X  | X  | 0  |
| 1 | 0 | 0  | X  | DI | DI |
| 1 | 0 | 1  | X  | X  | HOLDS |
| 0 | 1 | 0  | SI | X  | SI |
| 0 | 1 | 1  | X  | X  | 1  |
| 1 | 1 | 0  | SI | DI | SI XOR DI |
| 1 | 1 | 1  | X  | X  | TOGGLES |

When the control signals on lines A and B are both 0 the data output DO after a clock is always 0 irrespective of the values of signals PH, SI and DI. Thus as with the known BILBO register there is a mode of operation in which a register comprising circuit arrangements of FIG. 3 executes a reset. This will hereinafter be referred to as the RESET MODE.

In a second mode of operation the signals on the control lines A and B are set at 1 and 0 respectively and the control signal PH is set at 0 thereby connecting the data input DI to an input of the AND gate 8. During the second mode of operation the data output DO follows the data input DI providing operation as a normal register like that illustrated in FIG. 2(b). The second mode of operation will hereinafter be referred to as the NORMAL MODE.

In a third mode of operation the signals on the control lines A and B are set at 1 and 0 respectively and the control signal PH is set at 1 thereby connecting the data output DO to the input of the AND gate 8. During the third mode of operation the data output DO is held unchanged. The third mode of operation provides therefore a hold facility (HOLD MODE) there being no equivalent HOLD MODE in the known BILBO register.

In a fourth mode of operation the signals on the control lines A and B are set at 0 and 1 respectively and the control signal PH is set at 0. During the fourth mode of operation the data output DO follows the serial input SI so as to operate in either the test pattern generator mode or the scan mode depending on whether the serial input SI is receiving feedback from the register or is connected to the output of the last register. The fourth mode of operation is equivalent to the operation of the known BILBO register in FIGS. 2(d) and 2(c) and will hereinafter be referred to as the TEST PATTERN GENERATION/SCAN MODE.

In a fifth mode of operation the signals on the control lines A and B are 0 and 1 respectively whilst the control signal PH is set at 1. During the fifth mode of operation the data output DO is 1 and a register comprising circuit arrangements of FIG. 3 thereby has a preset facility (PRESET MODE). There is no PRESET MODE in the known BILBO register.

In a sixth mode of operation the signals on the control lines A and B are both 1 whilst the control signal PH is set at 0. During the sixth mode of operation the data output is dependent on both the serial input SI and the data input DI which are each present as an input signal on the respective inputs of the Exclusive-OR gate 4. A register comprising circuit arrangements of FIG. 3 behaves in its SIGNATURE ANALYSIS MODE during the sixth mode of operation which is similar to the mode of operation of the known BILBO register in FIG. 2(e).

In a seventh mode of operation the signals on the control lines A and B are both 1 whilst the control signal PH is set at 1. During the seventh mode of operation the data output DO changes state and a register comprising circuit arrangments of FIG. 3 has a toggle facility (TOGGLE MODE). There is no TOGGLE MODE in the known BILBO register.

One of the advantages of assembling circuit arrangements of FIG. 3 to form registers in an integrated circuit having a built-in self testing facility is that at some time during a self testing operation a large proportion of the circuitry can be made to operate in the configuration used during NORMAL MODE. For example, HOLD MODE uses the same values on control lines A and B as are used during the NORMAL MODE, and will only implement a hold function for those values on control lines A and B when the control line PH is set at 1. Thus the circuit arrangement of FIG. 3 provides an extra test on the circuitry directly connected to control lines A and B. Furthermore if the PH control lines of all the registers in the integrated circuit are connected to a single line under the control of a test controller, the test controller can place the circuit into a state where all the registers hold their data. In addition as the only difference between the HOLD MODE and the NORMAL MODE is that the signal on the control line connected to all the PH control inputs is inverted, then for the self test to be passed when that self-test includes a 'full hold' state the control line must be functional at every register and the circuitry connected to the control lines A and B must be operating correctly when 'normal operation' is indicated. By using the circuit arrangments of FIG. 3 in registers it is ensured that all the registers enter NORMAL MODE when required.

In addition, to the above facility for the test of the circuitry connected to the control lines A and B, a register comprising the circuit arrangement of FIG. 3 has additional features to the known BILBO register. One of these features has been referred to above as the HOLD MODE whereby the output data DO does not change state, independent of the data input DI or serial input SI. This facility may be used as part of the normal function of the register by appropriate gating on the PH control input, without invalidating the test on the circuitry connected to the control lines A and B.

The circuit arrangement of FIG. 3 also features the TOGGLE MODE in which the data output DO changes state on the arrival of each clock pulse. This is useful if it is desired to utilise the HOLD facility of the element as part of the NORMAL operation. For example, if both the control signals on A and B are high and the control signal PH is low, then the circuit is in its SIGNATURE ANALYSIS MODE. Whilst in the SIGNATURE ANALYSIS MODE, any preceding circuitry that is connected to the PH control input in order to implement a functional hold during normal operation, may occasionally raise the PH control input high. With the circuit configuration of FIG. 3 the effect is to invert the output state during the TOGGLE MODE without losing any signature analysis information.

The circuit arrangement of FIG. 3 also features the PRESET MODE whereby the output is set true independent of the data input DI or serial input SI. The known BILBO circuit arrangement of FIG. 1 only allows $2^{N-1}$ of all the possible $2^N$ test states (N being the number of register elements in the register) to be generated, usually the all zero state being the omitted state. The PRESET MODE allows a number of registers to be started off in the all zero state and subsequently preset to the all ones state from which the registers will cycle through all other states if configured into its TEST PATTERN GENERATION MODE. A register built from the circuit arrangements of FIG. 3 can generate therefore the complete set of $2^N$ test states.

Figure 4A:
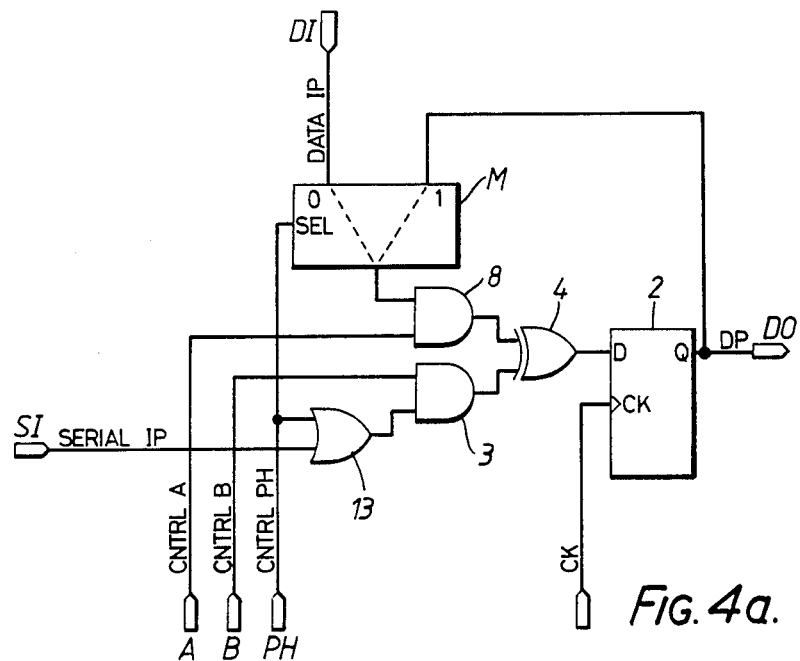
FIG. 4a is a further illustration of the circuit arrangement of FIG. 3.
Figure 4B:
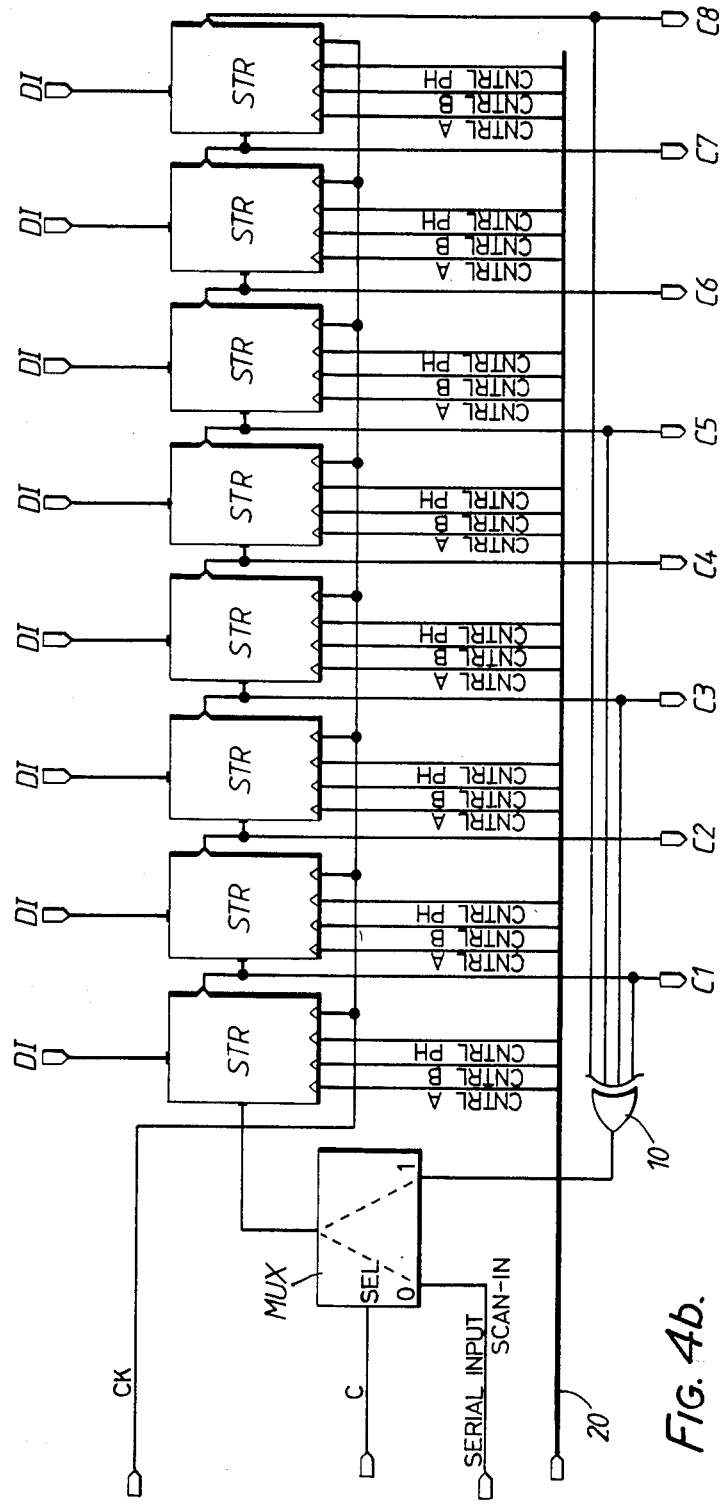
FIG. 4b illustrates an eight bit register comprising the circuit arrangement of FIG. 3.

In FIG. 4b a register in accordance with an embodiment of the present invention is illustrated comprising a plurality of circuit arrangements of FIG. 4a. The circuit arrangement of FIG. 4a is essentially the same as the circuit arrangement of FIG. 3 but is shown with its signal paths in a different configuration to facilitate understanding of FIG. 4b. The circuit arrangement of FIG. 4a will hereinafter be referred to as a structured test register (STR) and in FIG. 4b eight STR's are shown as arranged in series to form an eight bit register. Control signals A,B and PH are supplied along a three line bus 20. A multiplexer MUX and an Exclusive-OR gate 10 are required as with the BILBO register of FIG. 2a.

It will be appreciated that the present invention is not restricted to the particular circuit arrangement illustrated in FIGS. 3 and 4a, other circuit arrangements having gates of different types being within the scope of the present invention. The many forms of other embodiments are best described with reference to FIG. 5 which is a circuit arrangement similar to that shown in FIG. 4a but differing in that the AND gate 8, AND gate 3, Exclusive-OR gate 4 and the OR gate 13 are each replaced by a respective first gate 20, second gate 22, third gate 24 and fourth gate 26.

Figure 5:
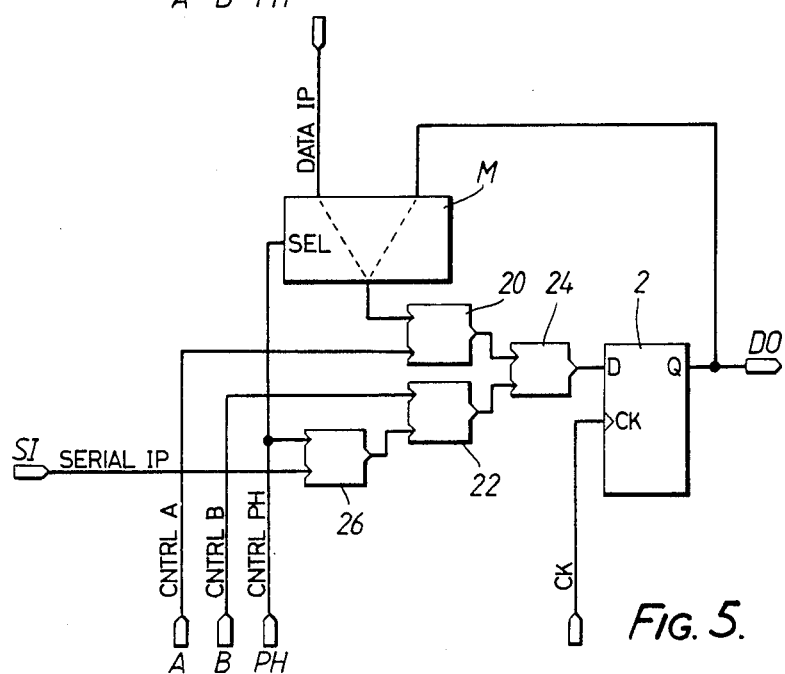
FIG. 5 illustrates a circuit arrangement in accordance with embodiments of the present invention.

Referring to FIG. 5 the first gate 20 may take the form of an AND gate, a NAND gate, an OR gate or a NOR gate; the second gate 22 may likewise take the form of an AND gate, a NAND gate, an OR gate or a NOR gate and similarly the fourth gate 26 may take the form of an AND gate, a NAND gate, an OR gate or a NOR gate. The third gate 24 is either an Exclusive-OR gate or preferably an Exclusive-NOR gate. The selections and configurations chosen for the gates 20,22,24 and 26 determine the truth table of the circuit arrangements and on modifications which can be made to the circuit arrangement by the inclusion or omission of inverters in the signal paths to or from the inputs of the gates 20,22,24 and 26 or the flip-flop 2 or the Multiplexer M. As will be appreciated there are a number of circuit arrangements that can be formed conforming to FIG. 5 and by way of example six embodiments will now be described with reference to FIGS. 5a, 5b, 5c, 5d, 5e and 5f.

Figure 5A:
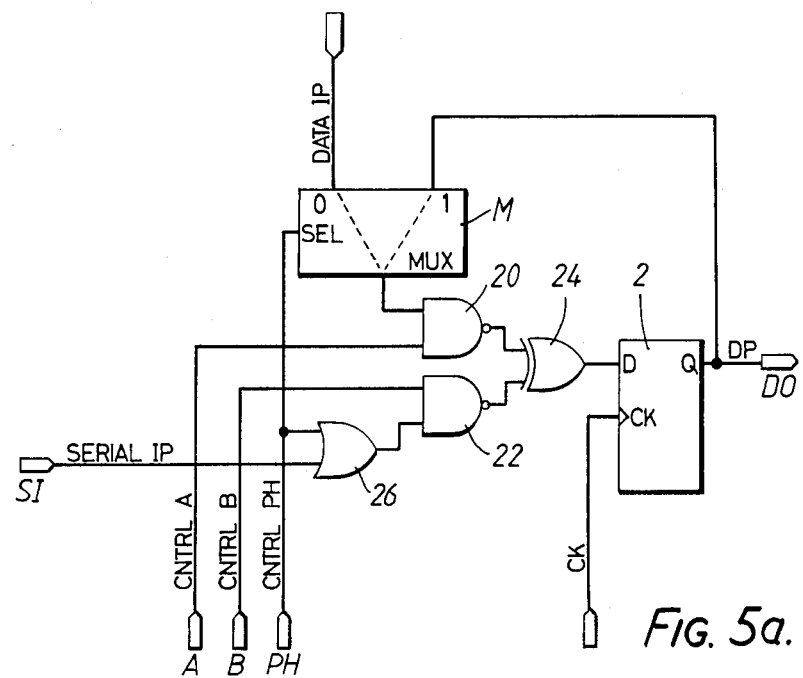
FIGS. 5a, 5b, 5c, 5d, 5e and 5f illustrate six circuit arrangements conforming to FIG. 5 in accordance with different embodiments of the present invention.

In FIG. 5a the first and second gates 20, 22 are NAND gates, the third gate 24 is an Exclusive-OR gate and the fourth gate 26 is an OR gate. The employment of two NAND gates as the first and second gates 20, 22 is preferred as they in general have a speed of response advantage over any other pair of gates permissable for use as the first and second gates 20, 22. The truth table for this circuit arrangement is the same as that illustrated in truth table 1.

Figure 5B:
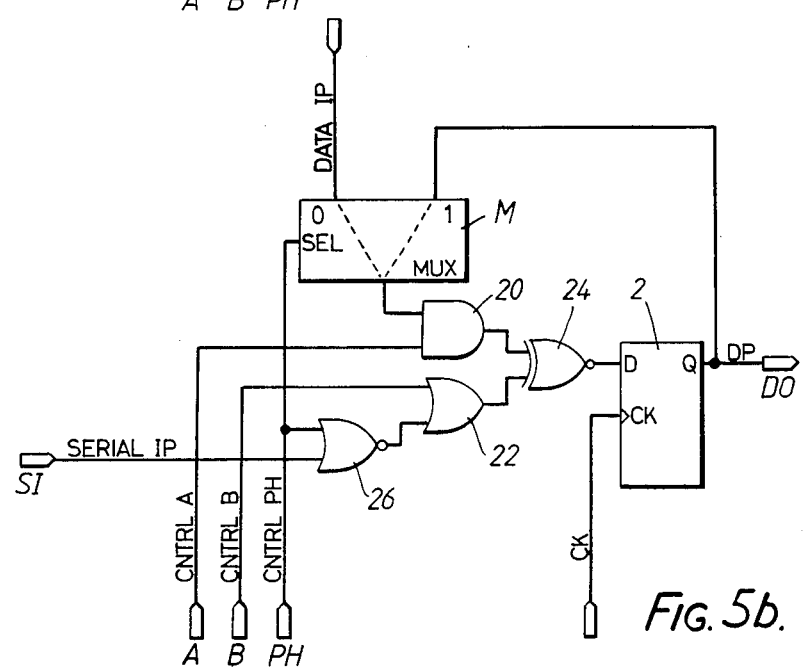

In FIG. 5b the first gate 20 is an AND gate, the second gate 22 is an OR GATE, the third gate 24 is an Exclusive-NOR gate and the fourth gate 26 is a NOR gate. The employment of an Exclusive-NOR gate, as opposed to an Exclusive-OR gate, for the third gate 24 is preferred as the Exclusive-NOR gate has faster input to output delay times compared to that of the Exclusive-OR gate. The truth table for the circuit arrangement of FIG. 5b is illustrated in truth table 2.

TRUTH TABLE 2

| A | B | PH | SI | DI | DO |
|---|---|----|----|----|----|
| 0 | 1 | X  | X  | X  | 0  |
| 1 | 1 | 0  | X  | DI | DI |
| 1 | 1 | 1  | X  | X  | HOLDS |
| 0 | 0 | 0  | SI | X  | SI |
| 0 | 0 | 1  | X  | X  | 1  |
| 1 | 0 | 0  | SI | DI | SI XOR DI |
| 1 | 0 | 1  | X  | X  | TOGGLES |

Figure 5C:
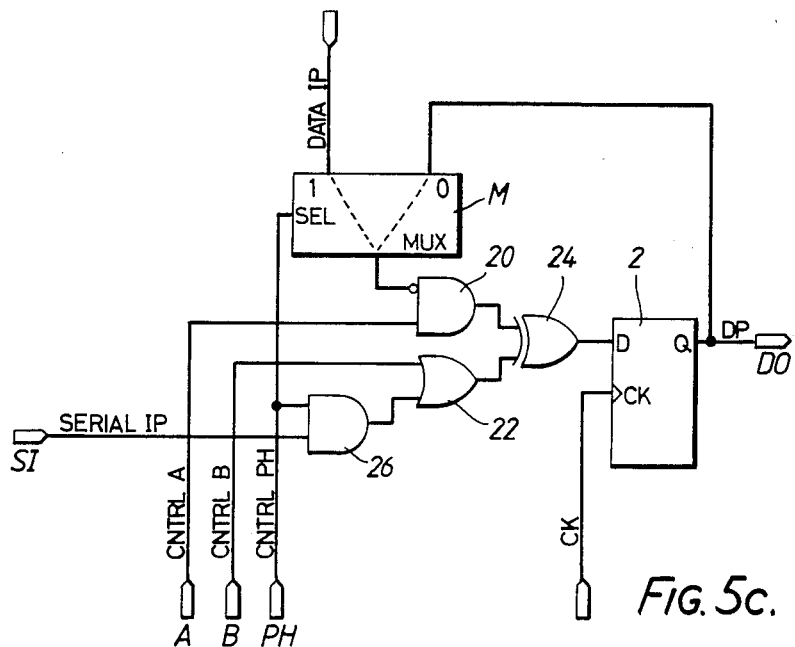

In FIG. 5c an inverter is disposed on the signal path between the multiplexer M and an input of the first gate 20, the first gate being an AND gate. The second gate 22 is an OR gate, the third gate 24 an Exclusive-OR gate and the fourth gate 26 an AND gate. A truth table 3 for this circuit arrangement is:

TRUTH TABLE 3

| A | B | PH | SI | DI | DO |
|---|---|----|----|----|----|
| 0 | 1 | X  | X  | X  | 1  |
| 1 | 1 | 1  | X  | DI | DI |
| 1 | 1 | 0  | X  | X  | HOLDS |
| 0 | 0 | 1  | SI | X  | SI |
| 0 | 0 | 0  | X  | X  | 0  |
| 1 | 0 | 1  | SI | DI | SI XNOR DI |
| 1 | 0 | 0  | X  | X  | TOGGLES |

Figure 5D:
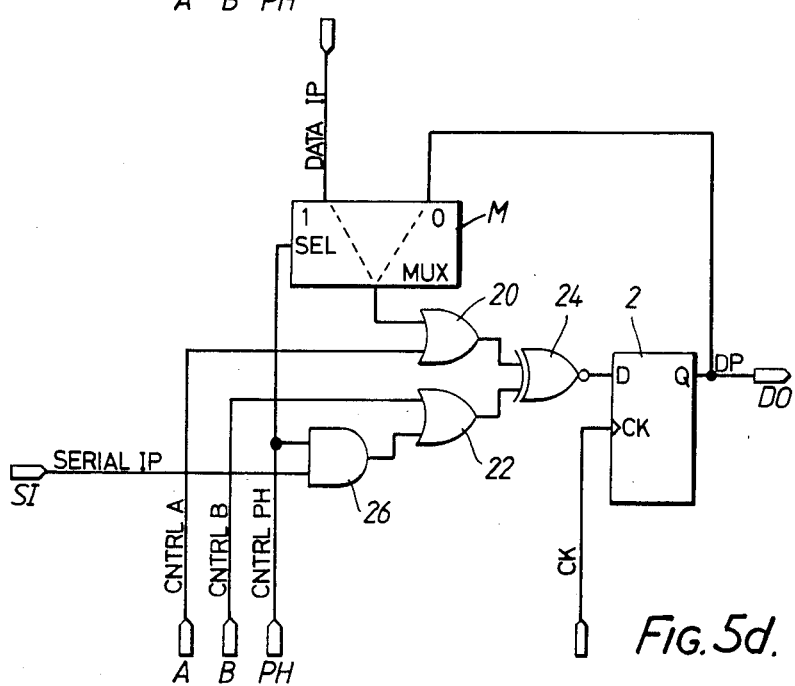

In FIG. 5d the first and second gates 20, 22 are both OR gates, the third gate 24 is an Exclusive-NOR gate and the fourth gate 26 is an AND gate. A Truth table 4 for this circuit arrangement is:

TRUTH TABLE 4

| A | B | PH | SI | DI | DO |
|---|---|----|----|----|----|
| 1 | 1 | X  | X  | X  | 1  |
| 0 | 1 | 1  | X  | DI | DI |
| 0 | 1 | 0  | X  | X  | HOLDS |
| 1 | 0 | 1  | SI | X  | SI |
| 1 | 0 | 0  | X  | X  | 0  |
| 0 | 0 | 1  | SI | DI | SI XNOR DI |
| 0 | 0 | 0  | X  | X  | TOGGLES |

Figure 5E:
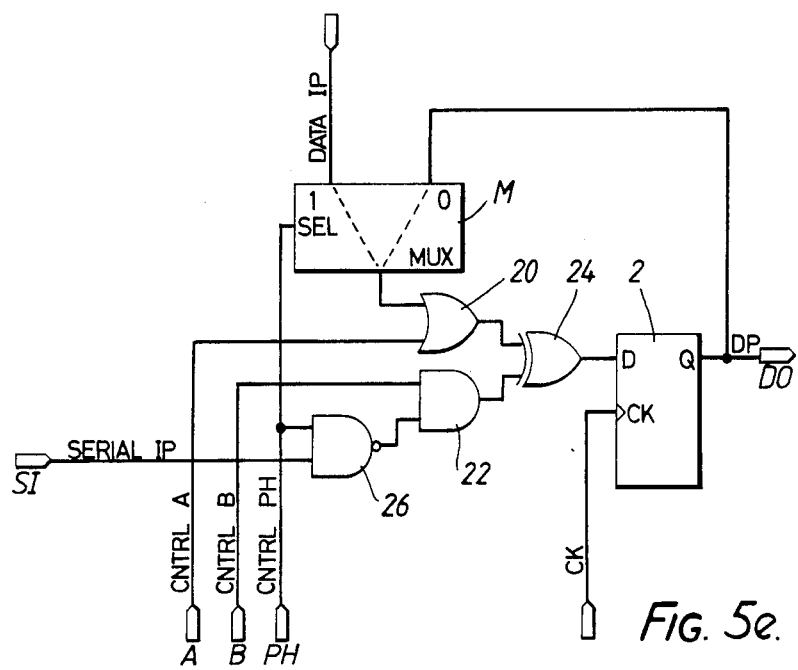

In FIG. 5e the first gate 20 is an OR gate, the second gate 22 is an AND gate, the third gate 24 is an Exclusive-OR gate and the fourth gate 26 is a NAND gate. A truth table 5 for this circuit arrangement is:

TRUTH TABLE 5

| A | B | PH | SI | DI | DO |
|---|---|----|----|----|----|
| 1 | 0 | X  | X  | X  | 1  |
| 0 | 0 | 1  | X  | DI | DI |
| 0 | 0 | 0  | X  | X  | HOLDS |
| 1 | 1 | 1  | SI | X  | SI |
| 1 | 1 | 0  | X  | X  | 0  |
| 0 | 1 | 1  | SI | DI | SI XNOR DI |
| 0 | 1 | 0  | X  | X  | TOGGLES |

Figure 5F:
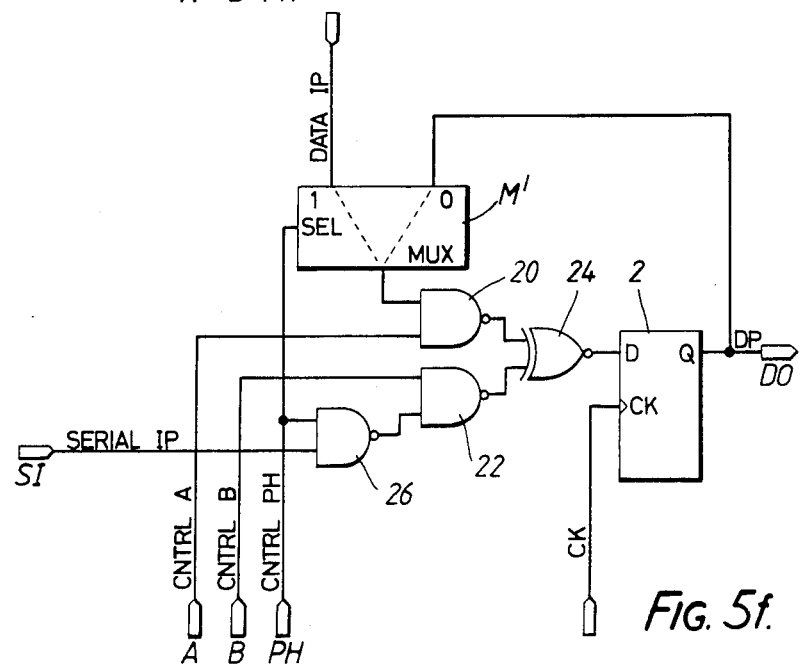

The preferred structured test register (STR) according to the present invention is illustrated in FIG. 5f. The first, second and fourth gates 20, 22 and 26 are all NAND gates which in general have faster input to output delay times compared to the other gates which may be employed. The third gate 24 is an Exclusive-NOR gate which has a faster input to output delay time compared to that of an Exclusive-OR gate. An inverting multiplexer $M^1$ is also adopted as it can have advantages over the non-inverting forms depending upon its precise implementation. A truth table 6 for the circuit arrangement of FIG. 5f is:

TRUTH TABLE 6

| A | B | PH | SI | DI | DO | Mode |
|---|---|----|----|----|-----|------|
| 0 | 0 | X  | X  | X  | 1   | :Preset Mode |
| 1 | 0 | 1  | X  | DI | DI  | :Normal Mode |
| 1 | 0 | 0  | X  | X  | HOLDS | :Hold Mode |
| 0 | 1 | 1  | SI | X  | SI  | :TPG/Scan Mode |
| 0 | 1 | 0  | X  | X  | 0   | :Reset Mode |
| 1 | 1 | 1  | SI | DI | SI XNOR DI | :Signature Analysis Mode |
| 1 | 1 | 0  | X  | X  | TOGGLES | :Toggle Mode |

Referring to the Truth Table 6 the Reset Mode results from changing the state of the control input PH when the STR of FIG. 5f is in its Test Pattern Generator/Scan Mode. This facility may be used advantageously when an Exclusive-NOR gate is provided in the feedback path of the register. By way of example, if each of the eight STR in the register of FIG. 4b take the form of the STR illustrated in FIG. 5f then in a preferred embodiment of register the Exclusive-OR gate 10 in the feedback path is replaced by an Exclusive-NOR gate.

The following sequence may be used to effect a completely exhaustive test on a block of combinatorial logic. Note that all STRs may have their PH control inputs connected together.

(1) Preset the STRs on both the input and the output of the combinatorial logic block to be tested (A,B=0,0).

(2) Configure the STR on the input of the combinatorial logic as a test pattern generator (A,B,PH=0,1,1), and the STR on the output as a signature analyser (A,B,PH=1,1,1). Clock the circuit to capture the response of the combinatorial logic to the all-one input pattern which was established in (1) above.

(3) Pulse the PH control inputs to logic 0 in order to start (or "seed") the test pattern generator by resetting it. This will cause the signature analyser to toggle, but this of little consequence as all signature information is preserved.

(4) Continue the test with the PH control inputs at logic 1 until all input patterns have been generated.

As will be appreciated there are many other circuit arrangements which conform to the circuit arrangement of FIG. 5 and they are each an embodiment of the present invention. There are however only sixteen truth tables (six of which have been illustrated above) for the logic for all of the circuit arrangements, the reason being that separate groups of circuit arrangements behave in a logically equivalent manner. As described above the different circuit arrangements shown in FIGS. 3 and 5a for example have the same truth table 1 and therefore behave in a logically equivalent manner.

There are two possible inputs 1 and 0 which can be applied to each of the control lines A, B and PH resulting in eight possible input combinations to the control lines A, B and PH. Each of the input combinations determines the same respective functional mode of operation for logically equivalent circuit arrangements, seven input combinations each defining a respective functional mode of operation and the eighth input combination being also associated with either the RESET or PRESET MODE. Referring to the truth table 1 for example the RESET MODE has two possible input combinations for the control lines A,B and PH, namely 000 and 001, whereas referring to the truth table 3 for example the PRESET MODE has two possible combinations, namely 010 and 011.

It will also be seen that an inversion in the control signal PH for logically equivalent circuits having the truth table 1 is sufficient to change the operation of those circuits between the SCAN PATH MODE and the PRESET MODE, whereas an inversion in the control signal PH for logically equivalent circuits having the truth table 3 changes the operating mode of those circuits between the SCAN PATH MODE and the RESET MODE.

The present invention provides therefore a choice between two basic groups of circuit arrangements, in one group the inversion of the control signal PH at an appropriate time results in a change of operating mode from the SCAN PATH MODE to the RESET MODE whilst in the second group the inversion of the control signal PH at an appropriate time results in a change of operating mode from the SCAN PATH MODE to the PRESET MODE. As there are eight possible input combinations to the control lines A, B and PH, each input combination defining a characteristic operating mode for logically equivalent circuit arrangements within their associated group, so that are sixteen possible truth tables for all the circuit arrangements conforming to FIG. 5.

Figure 6A:
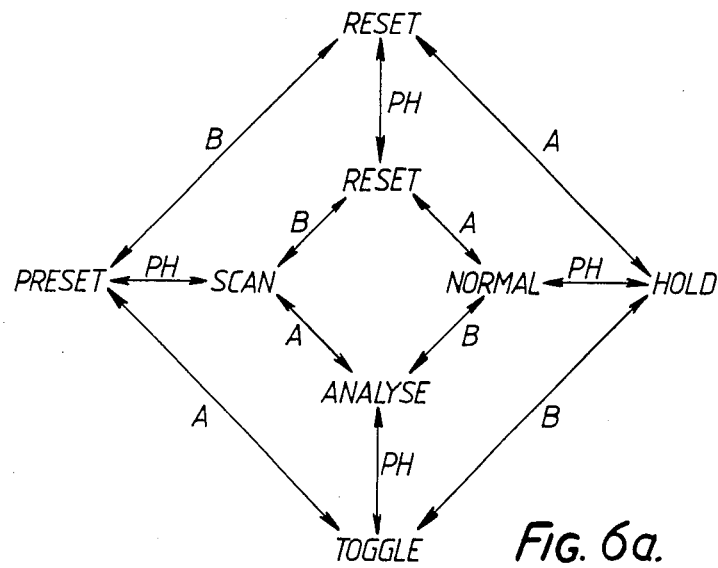
FIGS. 6a and 6b are diagrams showing logic adjacency of the seven operating modes of circuit arrangements conforming to the present invention.
Figure 6B:
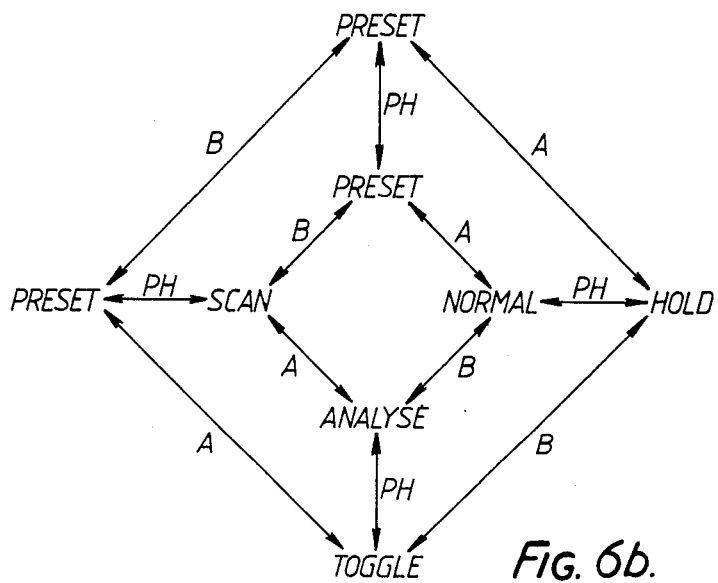

FIGS. 6a and 6b each illustrate the logically adjacent operating modes for the respective basic groups of circuit arrangements with arrows interconnecting adjacent operating modes. To change the operation of any logically equivalent circuit in one of the two basic groups between the adjacent operating modes requires an inversion in the signal on one of the control lines A,B or PH. The appropriate control line A,B or PH is identified on each of the arrows interconnecting the pairs of adjacent operating modes.

FIG. 6a illustrates logically adjacent operating modes applicable to the circuit arrangements shown in FIGS. 3, 5a and 5b, and FIG. 6b illustrates logically adjacent operating modes applicable to the circuit arrangements shown in FIGS. 5c, 5d, 5e and 5f.

Circuit arrangements in accordance with embodiments of the present invention are coupled together in series to define a register. The registers are advantageously employed in the design of integrated circuits or parts thereof having a self test design, particularly very large integrated circuits designed by partitioning into combinatorial logic blocks and register blocks. Such methods of testing and circuitry design are described in our co-pending U.K. Patent Application No. 8432533.

We claim:

1. An integrated circuit arrangement for use in an integrated circuit having a built-in self test design, the integrated circuit arrangement comprising first and second gates each of which has an input coupled to a respective control line, a third gate coupled to receive the outputs of the first and second gates and a flip-flop coupled to receive the output of the third gate wherein the improvement lies in the provision of a data selector means coupled to a second input of the first gate, the data selector means being controllable by a control signal to feed either input data or output data of the circuit arrangement to said second input of the first gate and a fourth gate the output of which is coupled to a second input of the second gate, the fourth gate having an input connected to receive a signal dependent on the control signal to the data selector means, a second input of the fourth gate being provided for receiving input signals.

2. An integrated circuit arrangement as claimed in claim 1 wherein the first, second and fourth gates are each selected from a respective group comprising an AND gate, a NAND gate, an OR gate and a NOR gate, the third gate being selected from a group comprising an Exclusive-OR gate and an Exclusive-NOR gate.

3. An integrated circuit arrangement as claimed in claim 2 wherein the first, second and fourth gates are NAND gates and the third gate is an Exclusive-NOR gate.

4. An integrated circuit arrangement as claimed in claim 2 wherein the first and second gates are AND gates, the third gate is an Exclusive-OR gate and the fourth gate is an OR gate.

5. A register element comprising a plurality of integrated circuit arrangements as claimed in claim 1, the integrated circuit arrangements being coupled together in series.

6. A register element as claimed in claim 5 wherein the outputs of two or more of the flip-flops in the series are coupled to the inputs of an Exclusive-NOR gate the output of which is coupled to the input of one or more of the flip-flops in the series.

7. A register element comprising a plurality of integrated circuit arrangements as claimed in claim 1, the integrated circuit arrangements being coupled together in series wherein the third gate in at least one of the integrated circuit arrangements is an Exclusive-NOR gate and the outpus of two or more of the flip-flops in the series are coupled to the inputs of another Exclusive-NOR gate the output of which is coupled to the input of the one or more of the flip-flops in the series.

8. A register element as claimed in claim 7 wherein the output of said another Exclusive-NOR gate is coupled to the input of the first flip-flop via a multiplexer, an AND gate and an Exclusive NOR gate.

* * * * *